United States Patent
Low et al.

(10) Patent No.: US 9,318,953 B2
(45) Date of Patent: Apr. 19, 2016

(54) APPARATUS, SYSTEM, AND METHOD FOR VOLTAGE LEVEL SWITCHING

(75) Inventors: Chia How Low, Taman Idaman (MY); Luke A. Johnson, Queen Creek, AZ (US); Mun Fook Leong, Taman Bukit (MY)

(73) Assignee: Intel Corporation, Santa Clara, CA (US)

( * ) Notice: Subject to any disclaimer, the term of this patent is extended or adjusted under 35 U.S.C. 154(b) by 243 days.

(21) Appl. No.: 13/997,104

(22) PCT Filed: Mar. 22, 2012

(86) PCT No.: PCT/US2012/030163
§ 371 (c)(1),
(2), (4) Date: Jun. 21, 2013

(87) PCT Pub. No.: WO2013/141865
PCT Pub. Date: Sep. 26, 2013

(65) Prior Publication Data
US 2014/0232710 A1  Aug. 21, 2014

(51) Int. Cl.
| | |
|---|---|
| H02M 3/15 | (2006.01) |
| H02M 3/155 | (2006.01) |
| H03K 3/356 | (2006.01) |
| G09G 3/36 | (2006.01) |
| H03K 17/693 | (2006.01) |
| H03K 19/0185 | (2006.01) |

(52) U.S. Cl.
CPC ............ H02M 3/155 (2013.01); G09G 3/3696 (2013.01); H03K 3/356086 (2013.01); H03K 17/693 (2013.01); H03K 19/018521 (2013.01)

(58) Field of Classification Search
CPC .................. H03K 19/018521; H03K 17/102; H03K 3/017; G09G 3/3233; G09G 2320/0819; G09G 2320/0238; G09G 2320/0276
USPC .......................................................... 327/333
See application file for complete search history.

(56) References Cited

U.S. PATENT DOCUMENTS

| | | | |
|---|---|---|---|
| 4,538,102 A | 8/1985 | Takagi et al. | |
| 5,570,061 A | 10/1996 | Shimoda | |
| 6,476,664 B2 | 11/2002 | Rolandi et al. | |
| 2003/0117207 A1* | 6/2003 | Suk et al. | 327/333 |
| 2011/0090203 A1* | 4/2011 | Cho | 345/211 |

OTHER PUBLICATIONS

"International Application Serial No. PCT/US2012/030163, Search Report mailed Nov. 29, 2012", 3 pgs.
"International Application Serial No. PCT/US2012/030163, Written Opinion mailed Nov. 29, 2012", 5 pgs.

* cited by examiner

*Primary Examiner* — John Poos
(74) *Attorney, Agent, or Firm* — Schwegaman Lundberg & Woessner, P.A.

(57) ABSTRACT

Various embodiments include apparatus, systems, and methods having a reference node to receive a reference voltage, a first node to provide a signal, and a circuit. Such a circuit may include a second node to receive different voltages greater than the reference voltage and to cause the signal at the first node to switch between a first voltage greater than the reference voltage and a second voltage greater than the reference voltage. Other embodiments including additional apparatus, systems, and methods are described.

15 Claims, 9 Drawing Sheets

US 9,318,953 B2

APPARATUS, SYSTEM, AND METHOD FOR VOLTAGE LEVEL SWITCHING

PRIORITY APPLICATION

This application is a U.S. National Stage Application under 35 U.S.C. 371 from International Application No. PCT/US2012/030163, filed Mar. 22, 2012, which is hereby incorporated by reference in its entirety.

FIELD

Embodiments of this disclosure relate to integrated circuits. Some embodiments relate to voltage controllers.

BACKGROUND

Integrated circuits are often included in products, such as computers, cellular phones, televisions, memory devices, and many other electronic products. Some integrated circuits may operate with multiple voltages. In some situations, improper control of such voltages may affect operations in the integrated circuits or may lead to operational failures.

DETAILED DESCRIPTION

Figure 1:
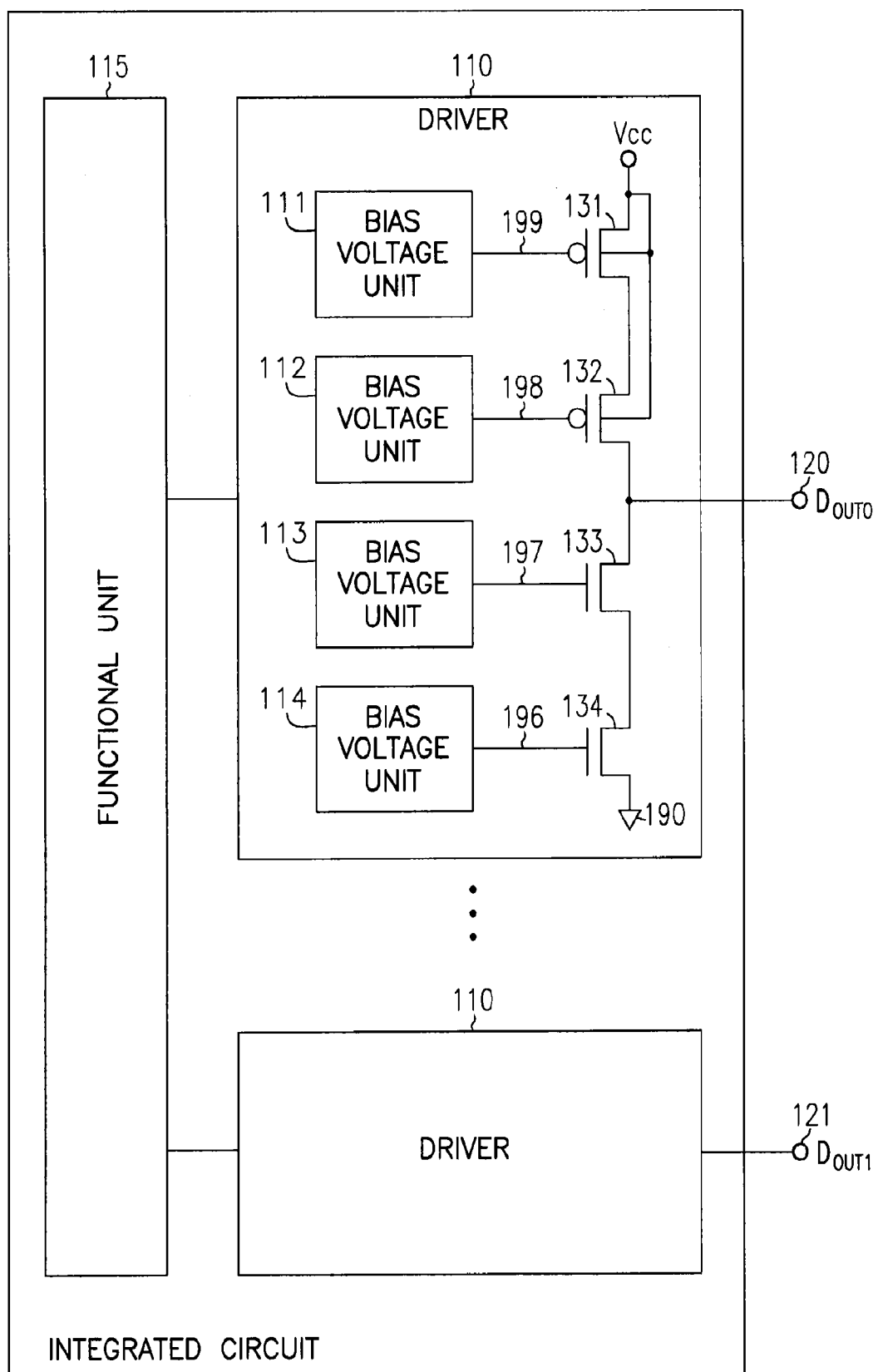
FIG. 1 shows a block diagram of an apparatus in the form of an integrated circuit, according to some embodiments described herein.

FIG. 1 shows a block diagram of integrated circuit (IC) 100 having drivers 110 to transfer information (e.g., in the form of signals) from a functional unit 115 to nodes 120 and 121. Nodes 120 and 121 may form part of input/output (I/O) nodes of IC 100. IC 100 may include a processor, a storage device (e.g., a Universal Serial Bus (USB) compliant storage device), a system on chip (SOC), or other electronic devices or systems.

For simplicity, FIG. 1 shows details of only one of drivers 110. Drivers 110 may include similar or identical circuit components. FIG. 1 shows integrated circuit 100 including two drivers 110 and two associated signals $D_{OUT0}$ and $D_{OUT1}$, as an example. The number of drivers may vary. As shown in FIG. 1, each of drivers 110 may include bias voltage units 111, 112, 113, and 114 to provide voltages at corresponding nodes 199, 198, 197, and 196 in order to control (e.g., turn on or off) transistors 131, 132, 133, and 134, respectively.

Transistors 131, 132, 133, and 134 may form an output stage to switch signal $D_{OUT0}$ at node 120 in full swing (e.g., rail to rail voltages), such as a swing between zero volts (e.g., ground potential at node 190) and a voltage Vcc (e.g., a supply voltage of IC 100), depending on the states (e.g., on or off) of transistors 131, 132, 133, and 134. For example, bias voltage units 111, 112, 113, and 114 may operate to turn on transistors 131, 132, 133 and turn off transistor 134 to switch signal $D_{OUT0}$ at node 120 from zero volts (0V) to voltage Vcc (e.g., 3.3V or some other positive voltage). In another example, bias voltage units 111, 112, 113, and 114 may operate to turn off transistors 131 and turn on transistors 132, 133, and 134 to switch signal $D_{OUT0}$ from voltage Vcc to 0V.

Nodes 197 and 198 may provide voltages such that transistors 132 and 133 may remain turned on when drivers 110 operate. For example, node 197 may provide a voltage (e.g., a fixed voltage) of 1.8V. Node 198 may provide a voltage (e.g., a fixed voltage) of 1.5V.

Node 196 may provide different voltages at different times to turn on or turn off transistor 134. For example, bias voltage unit 114 may operate as a pull-down pre-driver such that node 196 may provide a voltage of 1.8V to turn on transistor 134 and another voltage of 0V to turn off transistor 134.

Bias voltage unit 111 may operate to cause a signal at node 199 to switch between different voltages (e.g., non-zero and positive voltages) to turn on and turn off transistor 131. The different voltages at node 199 may not be in a full swing (e.g., not a rail to rail voltages). For example, bias voltage unit 111 may operate as a pull-up pre-driver such that the signal at node 199 may switch between a lower voltage (e.g., 1.8V) and a higher voltage (e.g., 3.3V) to turn on and turn off transistor 131.

Transistors 131, 132, 133, and 134 may have an operating voltage tolerance less than voltage Vcc of IC 100. For example, transistors 131, 132, 133, and 134 may have an operating gate-to-drain voltage (e.g., Vgd=1.8V), gate-to-source voltage (e.g., Vgs=1.8V), and drain-to-source voltage (e.g., Vds=1.8V) less than voltage Vcc (e.g., 3.3V) of IC 100. Switching node 199 between different voltages (e.g., 1.8V and 3.3V) to turn on transistor 131, as described above, and arrange transistors 131, 132, 133, and 134 in a stack (as shown in FIG. 1) may allow transistors 131, 132, 133, and 134 to operate safely (e.g., operate in an electrical overstress (EOS) safe condition).

At least part of integrated circuit 100 (e.g., drivers 110) may be configured to operate (e.g., transfer information in the form of signals) according to USB specification. The Universal Serial Bus Implementers Forum (USB-IF), in Portland, Oreg., U.S.A., manages and publishes the specifications for USB. Several specification revisions of USB have been published by USB-IF. In the description described herein, USB specification refers to USB 1.0, USB 2.0, and USB 3.0 and their specification revisions.

In FIG. 1, IC 100 may include circuitry (e.g., a USB controller) to enable drivers 110 to provide $D_{OUT0}$ and $D_{OUT1}$ signals according to USB classic (full speed and low speed) specification. For example, voltage Vcc of IC 100 may be provided with a voltage of 3.3V, such that each of signals $D_{OUT0}$ and $D_{OUT1}$ and may switch between 0V and 3.3V (e.g., from 0V to 3.3V or from 3.3V to 0V), according to USB classic 3.3V signaling. Thus, although transistors 131, 132, 133, and 134 may be designed to operate at a specified operating voltage V1 (e.g., 1.8V) less than voltage Vcc (e.g., 3.3V), the arrangement of transistors 131, 132, 133, and 134 with bias conditions, as described above, may allow drivers to operate according to USB specification (e.g., USB 2.0 specification).

One or more of bias voltage units 111, 112, 113, and 114 may include circuit components and operations similar to or identical to a voltage level shifter described below with reference to FIG. 2A through FIG. 7. For example, bias unit 111 may include circuit components and operations similar to or identical to of voltage level shifters of FIG. 2A and FIG. 4.

Figure 2A:
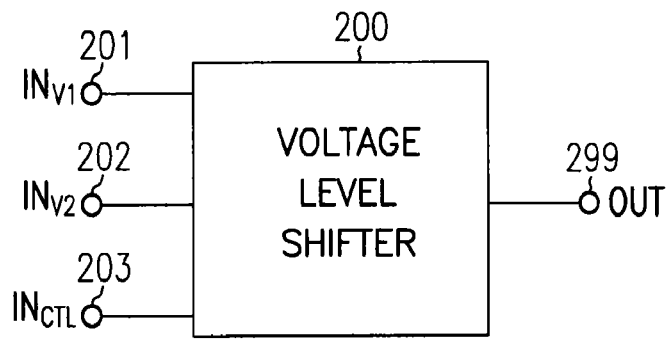
FIG. 2A shows a block diagram of an apparatus in the form of a voltage level shifter, according to some embodiments described herein.

FIG. 2A shows a block diagram of a voltage level shifter 200 including nodes (e.g., supply nodes) 201 and 202 to receive signals $IN_{V1}$ and $IN_{V2}$ respectively, a node 203 to receive a signal $IN_{CTL}$, and a node (e.g., output node) 299 to provide a signal (e.g., output signal) OUT. Voltage level shifter 200 may respond to signal $IN_{CTL}$ to switch signal OUT between different voltages, such as between the voltages corresponding to signal levels of signals $IN_{V1}$ and $IN_{V2}$. Voltage level shifter 200 can be included in bias voltage unit 111 of FIG. 1, such that output node 299 in FIG. 2A can correspond to node 199 of FIG. 1.

Figure 2B:
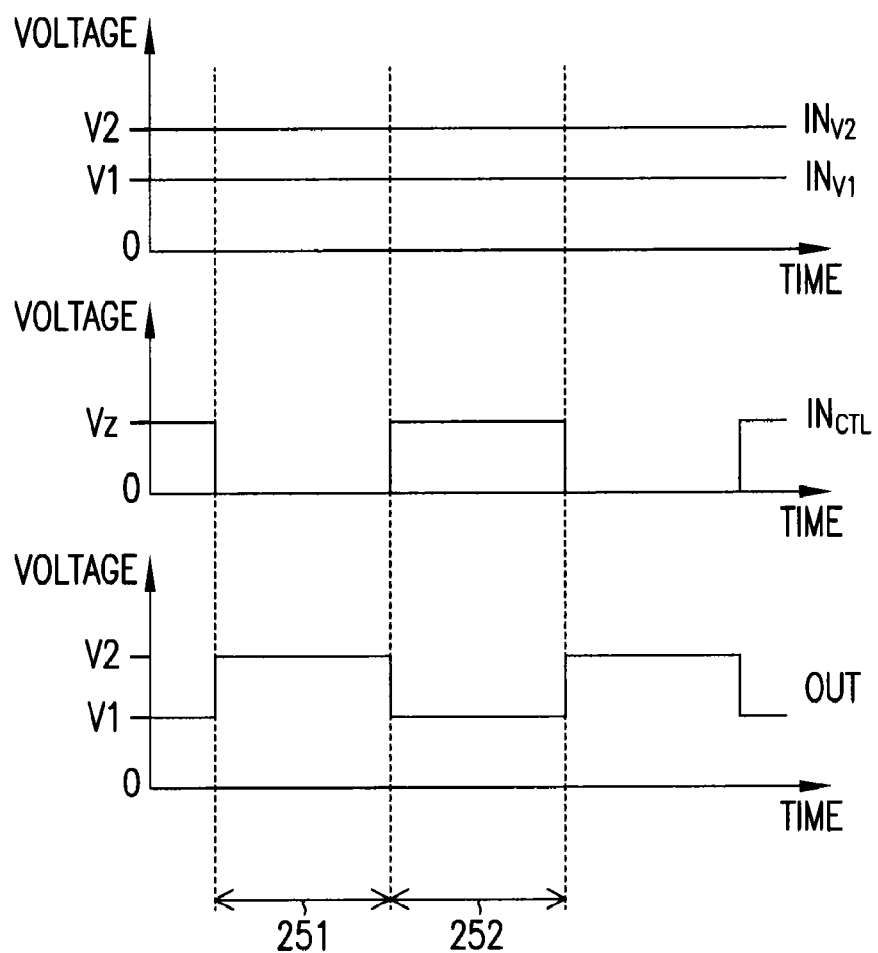
FIG. 2B is an example timing diagram at some nodes of voltage level shifter of FIG. 2A.

FIG. 2B is an example timing diagram showing waveforms of signals $IN_{V1}$, $IN_{V2}$, $IN_{CTL}$, and OUT of FIG. 2A. As shown in FIG. 2B, signals $IN_{V1}$ and $IN_{V2}$ may include signal levels corresponding to voltages V1 and V2, respectively. Signals $IN_{V1}$ and $IN_{V2}$ may remain at their respective voltages V1 and V2 during different time intervals, such as time intervals 251 and 252.

Voltages V1 and V2 may include supply voltages (e.g., Vcc) of a device or system that uses voltage level shifter 200. Each of voltages V1 and V2 may have a value greater than zero (e.g., greater than a ground potential). For example, voltages V1 and V2 may have values of approximately 1.8V and 3.3V, respectively.

As shown in FIG. 2B, signal $IN_{CTL}$ may switch between different signal levels, such as between a signal level corresponding to zero volts during time interval 251 and another signal level corresponding to a voltage Vx during a time interval 252. Voltage Vz and voltage V1 may have the same value (e.g., 1.8 volts).

Signal OUT may switch between different signal levels, such as between a signal level corresponding to voltage V2 during time interval 251 and another signal level corresponding to voltage V1 during time interval 252.

Thus, as described above with reference to FIG. 2A and FIG. 2B, voltage level shifter 200 may provide voltages (e.g., V1 and V2) in the form of signal OUT at output node 299. The voltages at node 299 may have values greater than zero (e.g., V1=1.8V and V2=3.3 V). The voltages at node 299 may not be in a full swing (e.g., not a rail to rail voltages). Voltage level shifter 200 may include circuit components and operations similar to or identical to those of a voltage level shifter described below with reference to FIG. 3A through FIG. 8.

Figure 3A:
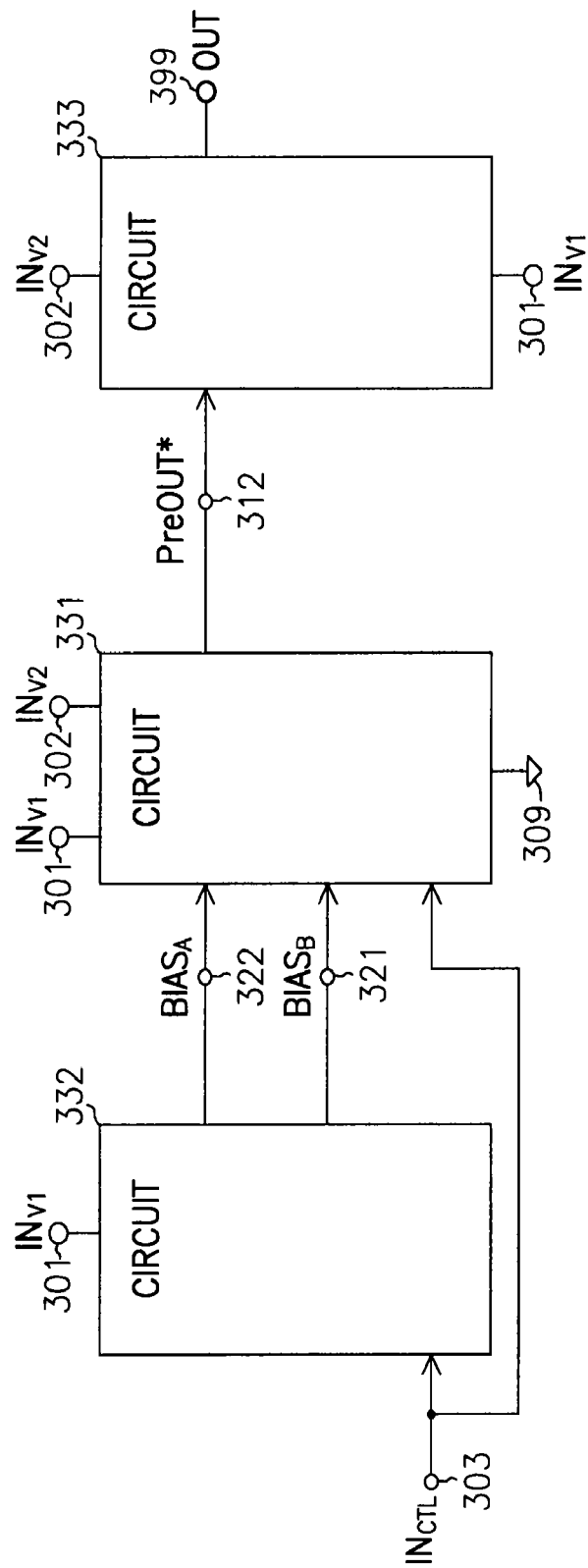
FIG. 3A shows a block diagram of apparatus in the form a voltage level shifter including circuits, according to some embodiments described herein.

FIG. 3A shows a block diagram of a voltage level shifter 300, according to some embodiments described herein. Voltage level shifter 300 may include circuits 331, 332, and 333, supply nodes 301 and 302 to receive signals $IN_{V1}$ and $IN_{V2}$, respectively, and a node 303 to receive signal $IN_{CTL}$. Voltage level shifter 300 may include a reference node 309 to receive a reference voltage (e.g., ground potential). As shown in FIG. 3, reference node 309 may include a ground potential node. Voltage level shifter 300 may include a node (e.g., output node) 399 to provide a signal (e.g., output signal) OUT. Signals $IN_{V1}$, $IN_{V2}$, $IN_{CTL}$, and OUT may correspond to those of voltage level shifter 200 described above with reference to FIG. 2A and FIG. 2B. Voltage level shifter 300 can be included in bias voltage unit 111 of FIG. 1, such that output node 399 in FIG. 3A can correspond to node 199 of FIG. 1.

Circuit 331 in FIG. 3 may operate to respond to signal $IN_{CTL}$, and signals $BIAS_A$ and $BIAS_B$ at nodes (e.g., input nodes) 322 and 321, respectively. Circuit 331 may provide a signal PreOUT* at a node 312 (e.g., first node). Based on voltages provided by signal $BIAS_A$ at node 322 (e.g., a second node) and signal $BIAS_B$ at node 321, circuit 311 may cause signal PreOUT* to switch between voltages (e.g., 1.8V and 3.3V) greater than a reference voltage (e.g., 0V) at node 309. The voltages provided by signal PreOUT* may correspond to the voltages provided by signals $IN_{V1}$ and $IN_{V2}$.

Circuit 332 may operate to respond to signal $IN_{CTL}$ to provide signals $BIAS_A$ and $BIAS_B$ to circuit 331. Each of signals $BIAS_A$ and $BIAS_B$ may provide different voltages at different time intervals. The different voltages may be based on the voltage provided by signal $IN_{V1}$.

Circuit 333 may operate to respond to signal PreOUT* to switch signal OUT at node 399 between voltages (e.g., 1.8V and 3.3V) corresponding to the voltages provided by signals $IN_{V1}$ and $IN_{V2}$.

FIG. 3 shows circuits 311, 332, and 333 being separated from each other as an example. Circuits 311, 332, and 333 may be arranged into a single circuit, two circuits, or other number of circuits.

Figure 3B:
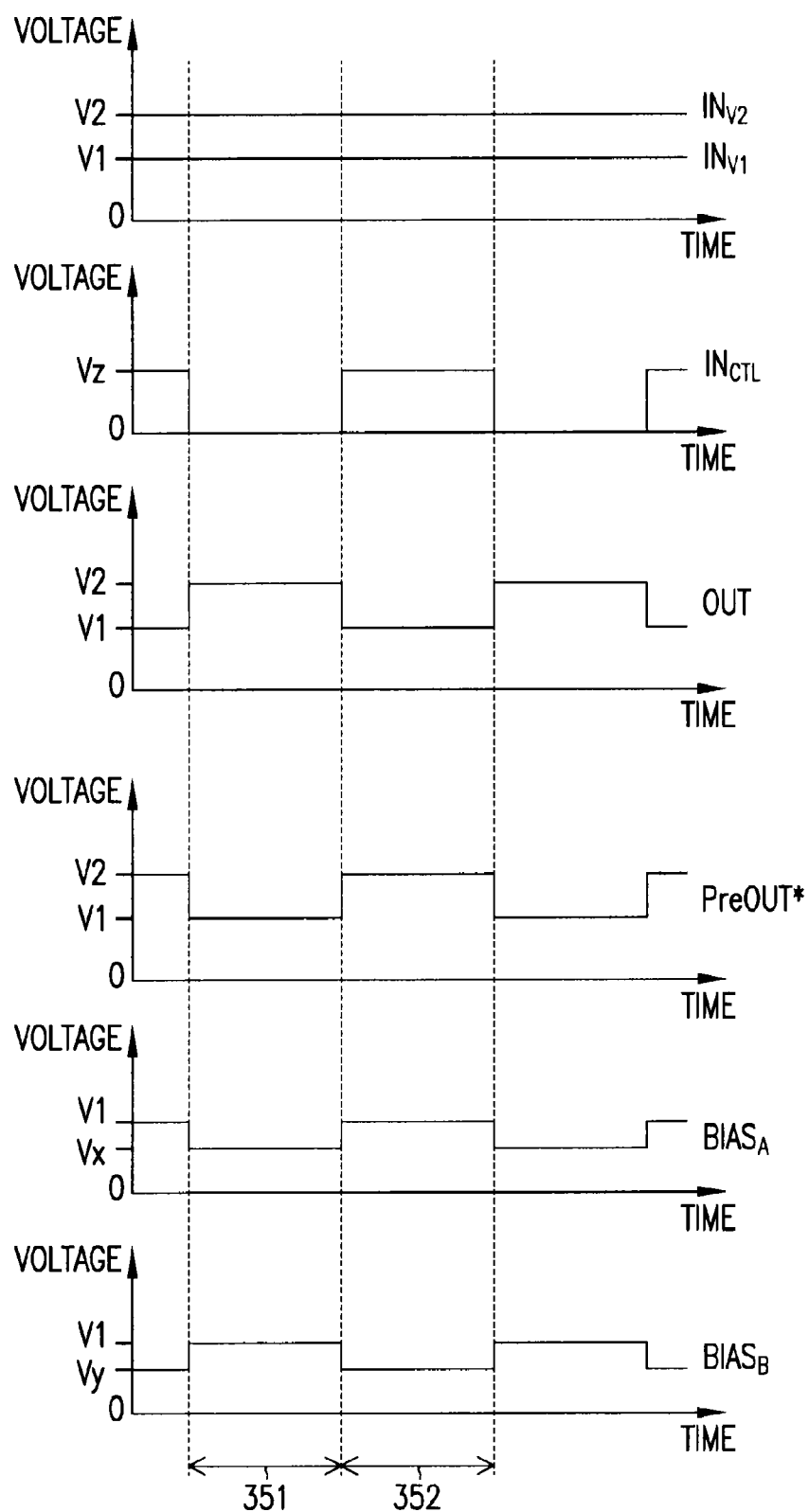
FIG. 3B is an example timing diagram at some nodes of voltage level shifter of FIG. 3A.

FIG. 3B is an example timing diagram showing waveforms of signals $IN_{V1}$, $IN_{V2}$, $IN_{CTL}$, OUT, PreOUT*, $BIAS_A$, and $BIAS_B$, of FIG. 3A. The waveforms of signals $IN_{V1}$, $IN_{V2}$, $IN_{CTL}$, OUT in FIG. 3B may have voltages similar to or identical to those of FIG. 2B.

As shown in FIG. 3B, signal PreOUT* may switch between voltages V1 (provided by signal $IN_{V1}$) and V2 (provided by signal $IN_{V2}$) during time intervals 351 and 352, respectively.

Signal $BIAS_A$ may have different signal levels corresponding to different voltages, such as Vx and V1 (provided by signal $IN_{V1}$). For example, signal $BIAS_A$ may have a signal level corresponding to voltage Vx during time interval 351 and another signal level corresponding to voltage V1 during time interval 352. Voltage Vx may have a value less than the value voltage V1, such that Vx=V1−Vtn, where Vtn represents the threshold voltage of transistors (not shown in FIG. 3A) of voltage level shifter 300. For example, if V1=1.8V and Vtn=0.5V, then Vx=1.3V.

Signal $BIAS_B$ may have different signal levels corresponding to different voltages, such as Vy and V1. For example, signal $BIAS_B$ may have a signal level corresponding to voltage V1 during time interval 351 and another signal level corresponding to voltage Vy during time interval 352. Voltage Vy may have a value less than the value voltage V1, such that Vy=V1−Vtn. For example, if V1=1.8V and Vtn=0.5V, then Vy=1.3V.

Signal OUT may not have a full swing. For example, a shown in FIG. 3B, signal OUT may have a signal level corresponding to voltage V2 during time interval 551 and another signal level corresponding to voltage V1 during time interval 552.

Voltage level shifter 300 may be included in a circuit (e.g., as part of a transmitter in a transceiver circuit) that operates according to USB specification, such as low speed and full speed operations according to USB 2.0 specification.

Voltage level shifter 300 may include circuit components and operations similar to or identical to those of a voltage level shifter described below with reference to FIG. 4 through FIG. 8.

Figure 4:
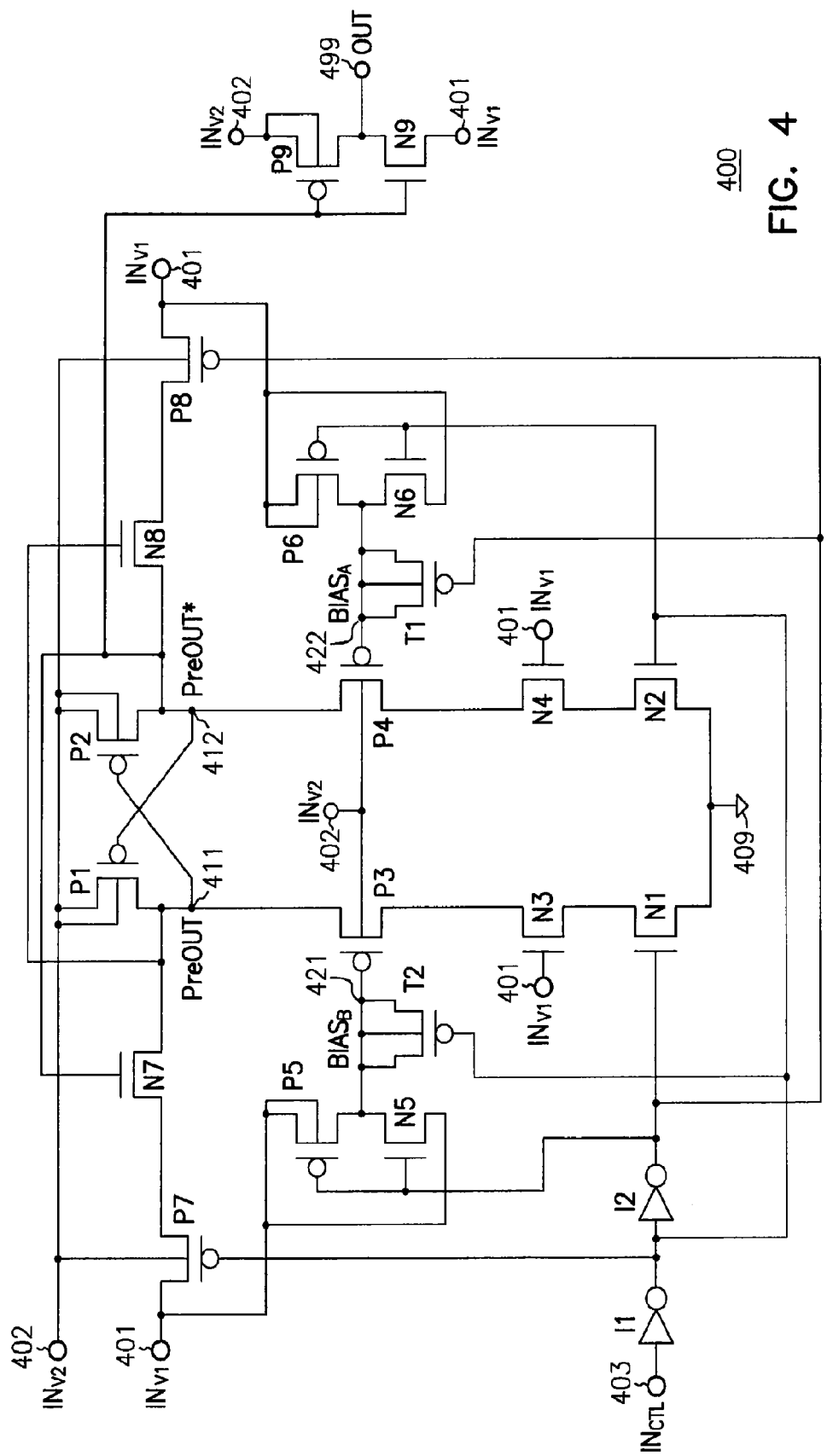
FIG. 4 shows a schematic diagram of a voltage level shifter, according to some embodiments described herein.

FIG. 4 shows a schematic diagram of a voltage level shifter 400 including transistors, P1, P2, P3, P4, P5, P6, P7, P8, and P9, transistors N1, N2, N3, N4, N5, N6, N7, N8, and N9, inverters I1 and I2, and devices T1 and T2. Voltage level shifter 400 may correspond to voltage level shifter 300 of FIG. 3A, such as forming circuits 331, 332, and 333 of FIG. 3A.

In FIG. 4, transistor P1 through P9 may include p-channel field effect transistors, such as p-channel metal-oxide semiconductor (PMOS) transistors. Transistor N1 through N9 may include n-channel field effect transistors, such as n-channel metal-oxide semiconductor (NMOS) transistors.

Inverters I1 and I2 may include complementary metal-oxide semiconductor (CMOS) inverters. Devices T1 and T2 may be configured to operate as capacitive devices. For example, devices T1 and T2 may include capacitors. As shown in FIG. 4, devices T1 and T2 may include transistors (e.g., PMOS) configured (e.g., having drain and source coupled together) to operate as capacitors.

Voltage level shifter 400 may include supply nodes 401 and 402 to receive signals $IN_{V1}$ and $IN_{V2}$, respectively, a node 403 to receive signal $IN_{CTL}$, and a node (e.g., output node) 499 to provide a signal (e.g., output signal) OUT. These signals can correspond to those of voltage level shifter 200 in FIG. 2A. Voltage level shifter 400 may include a reference node 409 to receive a reference voltage (e.g., ground potential). As shown in FIG. 4, reference node 409 may include a ground potential node.

Voltage level shifter 400 may include nodes 411 and 412 to provide signals PreOUT and PreOUT*, respectively. One of nodes 411 and 412 may correspond to node 312 of FIG. 3A. For example, node 412 may be referred to as a first node and may correspond to node 312 of FIG. 3A. In FIG. 4, based on signal $IN_{CTL}$, voltage level shifter 400 may switch each of signals PreOUT and PreOUT* between voltages corresponding to voltages (e.g., 1.8V and 3.3V) provided by signals $IN_{V1}$ and $IN_{V2}$. Voltage level shifter 400 may use signal PreOUT* at node 412 to switch signal OUT at node 499 between different voltages (e.g., 1.8V and 3.3V).

Voltage level shifter 400 may include nodes 421 and 422 coupled to the gates of transistors P3 and P4, respectively. Nodes 421 and 422 may include voltages presented by signals $BIAS_A$ and $BIAS_B$, respectively. Node 422 may be referred to as a second node and may correspond to node 322 of FIG. 3A.

Figure 5:
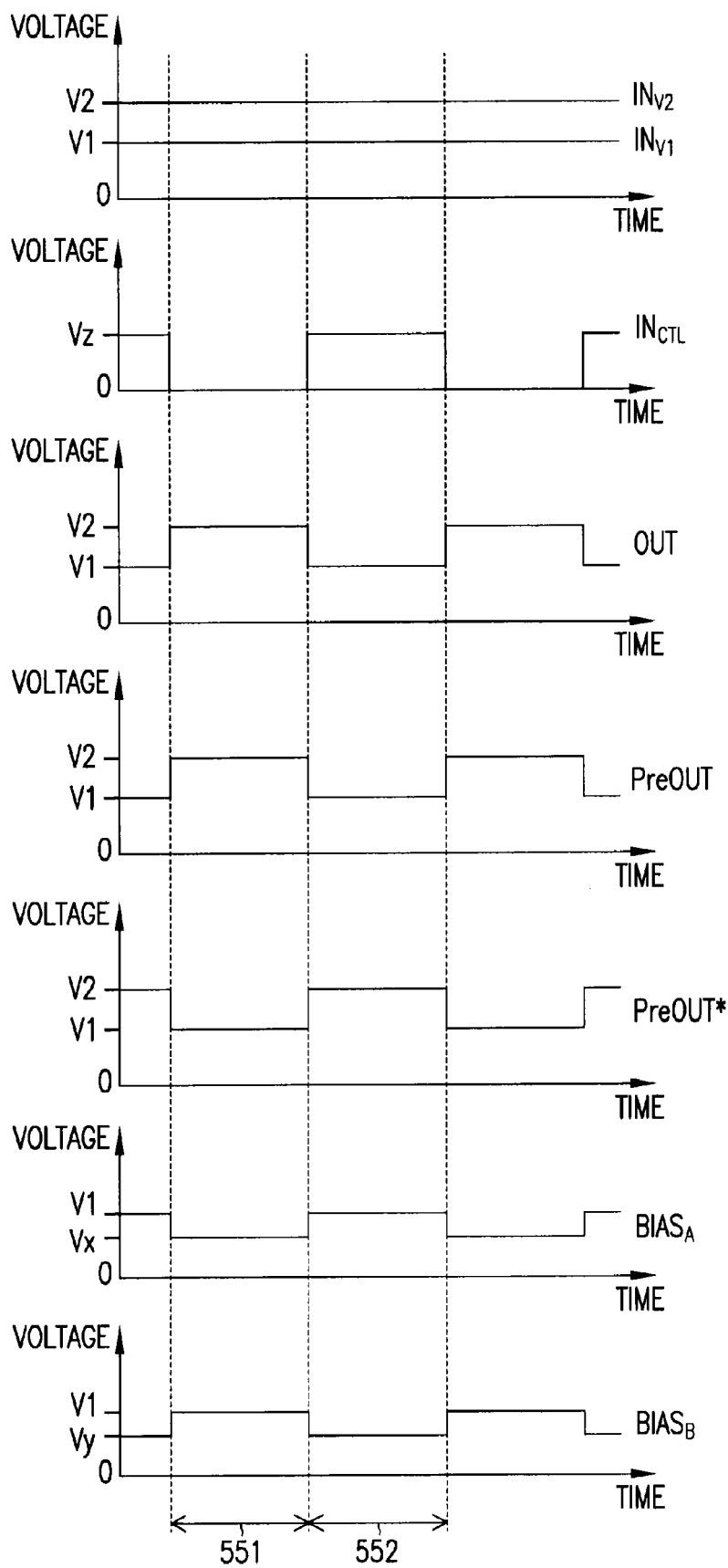
FIG. 5 is an example timing diagram at some of the nodes of the voltage level shifter of FIG. 4.

FIG. 5 is an example timing diagram showing waveforms of some of the signals of FIG. 4. The waveforms of signals $IN_{V1}$, $IN_{V2}$, $IN_{CTL}$, OUT in FIG. 5 may have voltages similar to or identical to those of FIG. 2B.

As shown in FIG. 5, each of signals PreOUT and PreOUT* may switch between voltages V1 and V2. For example, a during time interval 551, signal PreOUT may have a signal level corresponding to voltage V2 while signal PreOUT* may have a signal level corresponding to voltage V1. During a time interval 552, signal PreOUT may have a signal level corresponding to voltage V1 while signal PreOUT* may have a signal level corresponding to voltage V2.

Signals $BIAS_A$ and $BIAS_B$ may have signal levels similar to or identical to those of FIG. 3B. For example, signal $BIAS_A$ may have signal levels corresponding to voltages Vx and V1 during time intervals 551 and 552, respectively. Voltage Vx may have a value less than the value voltage V1, such that Vx=V1−Vtn, where Vtn represents the threshold voltage of NMOS transistors (e.g., transistor N6 in FIG. 4) of voltage level shifter 400. Signal $BIAS_B$ may have signal levels corresponding to voltages V1 and Vy during time intervals 551 and 552, respectively. Voltage Vy may have a value less than the value voltage V1, such that Vy=V1−Vtn. The value of voltage Vy can be equal to the value of voltage Vx.

In FIG. 4, transistors P1, P2, P3, P4, P5, P6, P7, P8, and P9, transistors N1, N2, N3, N4, N5, N6, N7, N8, and N9 of voltage level shifter 400 may have an operating voltage tolerance less than a voltage (e.g., V2) provided by signal $IN_{V2}$. For example, transistors 131, 132, 133, and 134 may have an operating parameters, such as gate-to-drain voltage (e.g., Vgd=1.8V), gate-to-source voltage (e.g., Vgs=1.8V), and drain-to-source voltage (e.g., Vds=1.8V) less than a voltage provided by signal $IN_{V2}$ (e.g., less than V2=3.3V) Switching signals PreOUT and PreOUT* between different voltages (e.g., positive voltages of 1.8V and 3.3V) to turn on respective transistors P2 and P1 (as described above) and arrange transistors P1, P2, P3, and P4 and N1, N2, N3, and N4 in a stack (as shown in FIG. 4) may allow transistors P1, P2, P3, and P4 and N1, N2, N3, and N4 to operate safely (e.g., operate with an electrical overstress safe condition) when a voltage at supply node 402 (e.g., 3.3V) is greater than the operating parameters (e.g., Vgd, Vgs, and Vds) of the transistors of voltage level shifter 400.

Some conventional voltage level shifters may operate with a specific supply voltage (e.g., 3.3V) and may use transistors (e.g., 3.3V tolerance thick-gate transistors) having an operating voltage tolerance with the same value as that specific supply voltage. However, if such transistors are not preferable or processes of such transistors are unavailable, then a voltage level shifter such as voltage level shifter 400 (FIG. 4) may be used. Thus, voltage level shifter 400 may allow removal of processes that produce transistors (e.g., 3.3V tolerance thick-gate transistors) having an operating voltage tolerance with the same value as that specific supply voltage of some conventional voltage level shifters, if such processes are not preferable or unavailable. This may improve (e.g., speed up) process technology scaling, such as using processes to produce 1.8V tolerance transistors to be included in voltage level shifter 400 that may use a supply voltage of 3.3V.

Voltage level shifter 400 in FIG. 4 may also have an improved performance in comparison with some conventional voltage level shifters. For example, some conventional voltage level shifters may include cascade transistors similar to transistors P3 and P4 and may use a fixed bias voltage (e.g., 1.5V) to bias the gates of such cascade transistors for EOS protection reason. The conventional voltage level shifters may generate pre-output signals, which may be similar to signals PreOUT and PreOUT* of FIG. 4. In the conventional voltage level shifters, however, using a fixed bias voltage to bias the gates of such cascade transistors, may not allow the pre-output signals to settle to steady state. This may degrade the performance of a conventional transmitter that employs conventional voltage shifters. Driver impedance and timing mismatch in such a conventional transmitter may occur. It may also be difficult for such a conventional transmitter to meet USB classic specification, such as rise/fall time, differential rise/fall time mismatch, and output signal crossover voltage for low speed and full speed operations.

In FIG. 4, with proper transistor sizing, voltage level shifter 400 may operate at a frequency in the hundreds of megahertz range (e.g., 200 MHz) at some voltage levels of signals $IN_{V1}$ and $IN_{V2}$. For example, with signals $IN_{V1}$ and $IN_{V2}$ provided with voltages of V1=1.8V and V2=3.3V, respectively, node 499 of voltage level shifter 400 may toggle signal OUT at frequency at around 200 MHz without introducing significant signal distortion. Thus, voltage level shifter 400 may be suitable for use in an output buffer that may support data transfers with multiple frequencies. For example, voltage level shifter 400 may be included in a circuit (e.g., as part of a transmitter in a transceiver circuit) that may support not only USB classic operations, but also some other operations, such as high speed 3.3V general purpose input/output (GPIO).

Figure 6:
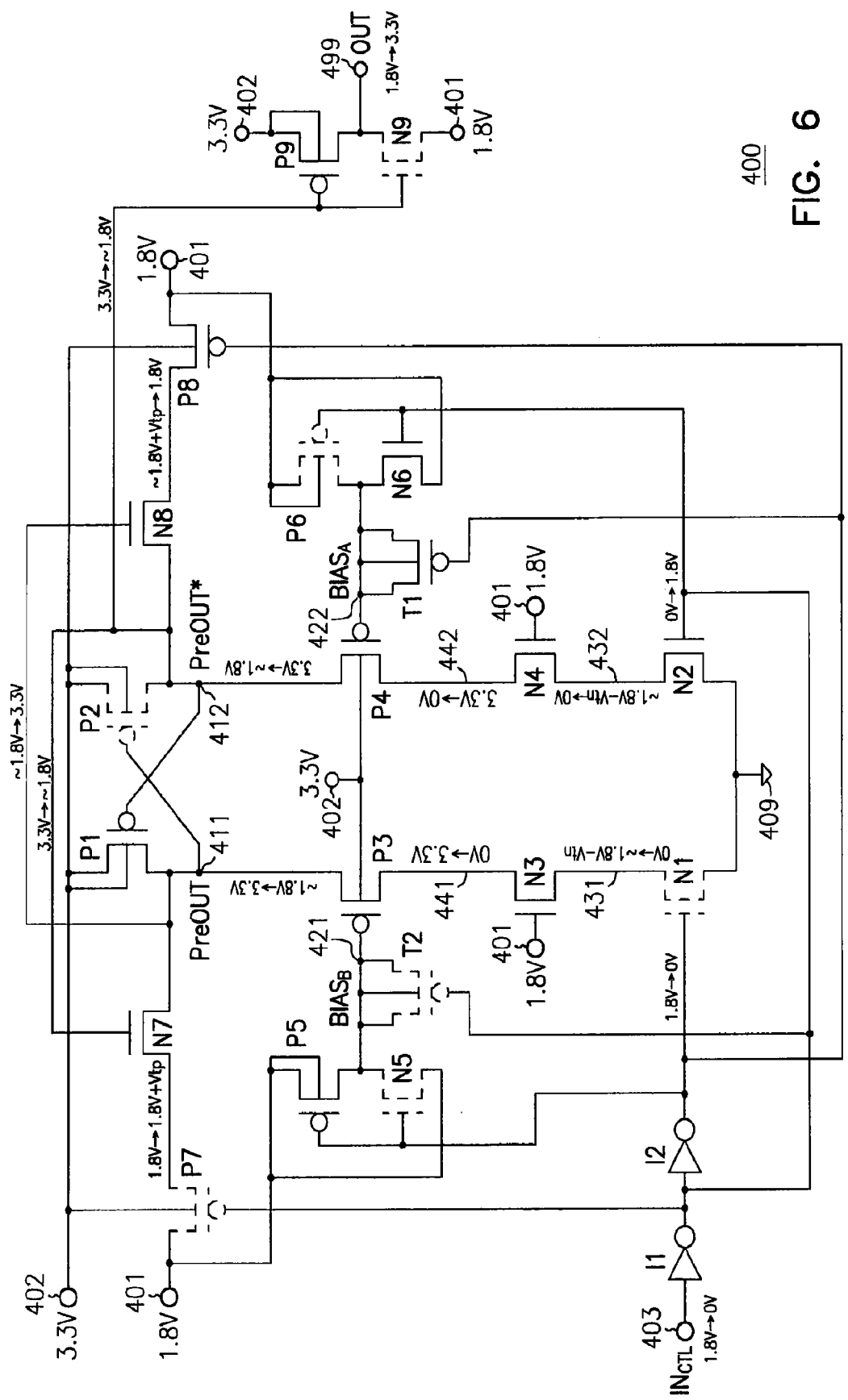
FIG. 6 shows the voltage level shifter of FIG. 4 in an operating mode where a signal at an output node of the voltage level shifter switches from a lower voltage to a higher voltage.

FIG. 6 shows example voltages at some nodes of voltage level shifter 400 in an operating mode where signal OUT switches from voltage V1 to voltage V2. The operating mode associated with FIG. 6 may occur at least in part during time interval 551 of FIG. 5.

In FIG. 6, 1.8V is used as an example value for voltage V1 (FIG. 5) provided by signal $IN_{V1}$, and 3.3 is used as an example value for voltage V2 (FIG. 5) provided by signal $IN_{V2}$. Other values may be used. Transistors N1, N5, N9, P2, P6, and P7, and device T2 in FIG. 6 are shown with dashed lines to indicate that these circuit components may be inactive (e.g., turned off).

In the operating mode associated with FIG. 6, signal OUT may switch from 1.8V to 3.3V. Detail operation of voltage level shifter 400 is as follows.

When signal $IN_{CTL}$ switches from 1.8V to 0V, transistor N1 may be turned off. Transistor N2 may turn on, causing the voltage at node 432 to go from approximately 1.8V (–1.8V) minus Vtn to 0V and the voltage at node 442 to go from 3.3V to 0V.

Device T1 may operate such that its capacitive coupling effect may cause the voltage at node 422 (which is coupled to the gate of transistor P4) to decrease (e.g., from voltage V1) to voltage Vx (FIG. 5). As described above, Vx=V1–Vtn. In this example, V1=1.8V. Thus, if Vtn=0.5V, then Vx=1.8V–0.5=1.3V.

If the voltage at node 422 decreases (e.g., due to device T1 discharging) to a value lower than that of voltage Vx (e.g., lower than 1.3V), transistor N6 may turn on and pull (e.g. electrically couple) node 422 to supply node 401. This causes the voltage at node 422 to be equal to 1.8V–Vtn=Vx (Vtn is the threshold voltage of transistor N6). Thus, when signal $IN_{CTL}$ switches from 1.8V to 0V, device T1 and transistor N6 operate to bias the gate of transistor P4 with voltage Vx (which is less than voltage V1=1.8V in this example).

The voltage at node 412 may go to Vx+Vtp where Vx is the voltage at node 422 and Vtp represents the threshold voltage of PMOS transistors (e.g., transistor P4) of voltage level shifter 400. Since Vx=V1–Vtn, as described above, Vx+Vtp=(V1–Vtn)+Vtp. Vtn and Vtp may have values approximately equal to each other. Thus, (V1–Vtn)+Vtp is approximately equal to V1. Therefore, in this example, the voltage at node 412 may have a value of approximately 1.8V. This may cause transistor P1 to fully turn on and pull node 411 to supply node 402. Thus, node 411 may be provided with a voltage of 3.3V (which is the voltage at supply node 402), causing transistor P2 to turn off and transistor N8 to turn on.

Transistor P8 may turn on when the voltage at node 403 is 0V. Thus, when transistor N8 turns on, it pulls node 412 to supply node 401 through transistor P8. Transistor N8 may allow the voltages at node 412 to be less dependent on the threshold voltage.

Near the beginning of the operating mode associated with FIG. 6 (e.g., before transistor P1 turns on), transistor P7 may turn off to isolate (e.g., electrically decouple) supply node 401 from transistor N7 in order to prevent a contention between transistors N7 and P1 from happening.

Since the voltage at node 403 is 0V, transistor N5 may turn off. Transistor P5 may turn on and pull node 421 (which is coupled to the gate of transistor P3) to supply node 401. Thus, node 421 may be provided with a voltage of 1.8V (which is the voltage at supply node 401). As a result, transistor P3 may be biased at its gate with a voltage of 1.8V and cause the voltage at node 441 to go from 0V to 3.3V with safe electrical overstress condition.

As shown in FIG. 6, transistor N3 may turn on and cause the voltage at node 431 to go from 0V to approximately 1.8V–Vtn. The gates of transistors N3 and N4 may be coupled to supply node 401, such that transistors N3 and N4 turn on during time interval 551 (FIG. 5) to provide safe electrical overstress condition to transistors N1 and N2.

Transistor P9 and N9 may form a circuit that responds to signal PreOUT* at node 412 to switch signal OUT between 1.8V and 3.3V. In this example, since the voltage at node 412 is approximately 1.8V, transistor N9 may turn off. Transistor P9 may turn on and pull output node 499 to supply node 402. Thus, output node 499 may be provided with a voltage of 3.3V. If voltage level shifter 400 is included in bias voltage unit 111 of FIG. 1 and node 499 of FIG. 6 corresponds to node 199 of FIG. 1, then a voltage of 3.3V (FIG. 6) may turn off transistor 131 of FIG. 1. This may cause signal $D_{OUT0}$ (FIG. 1) to switch to a level corresponding to a voltage at node 190 (e.g., 0V), as described above with reference to FIG. 1.

Figure 7:
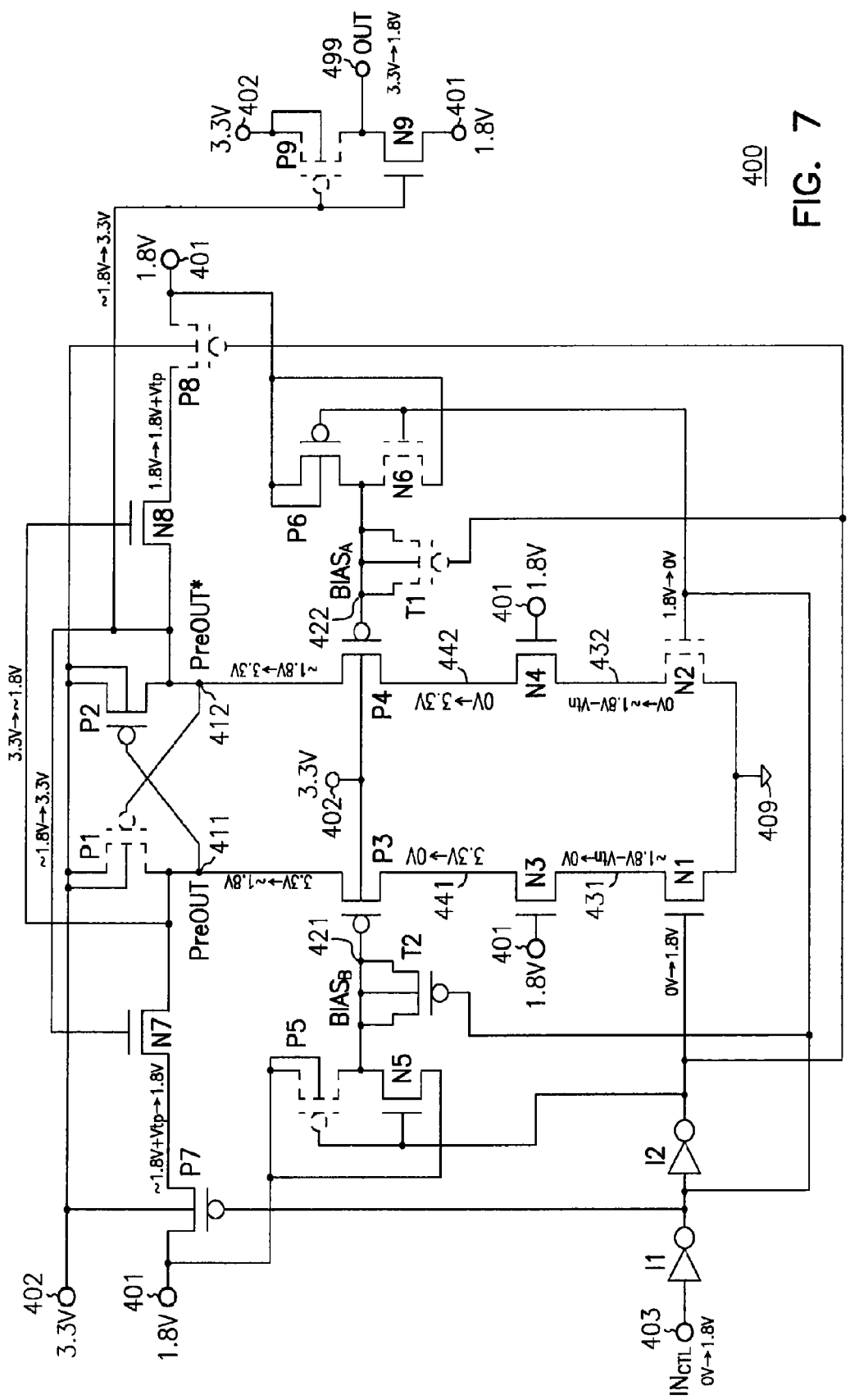
FIG. 7 shows the voltage level shifter of FIG. 4 in another operating mode where the signal at the output node of the voltage level shifter switches from a higher voltage to a lower voltage.

FIG. 7 shows example voltages at some nodes of voltage level shifter 400 in an operating mode where signal OUT switches from voltage V2 (e.g., 3.3V) to voltage V1 (e.g., 1.8V). The operating mode associated with FIG. 7 may occur at least in part during time interval 552 of FIG. 5.

Transistors N2, N6, P1, P5, P8, and P9, and device T1 in FIG. 7 are shown with dashed lines to indicate that these circuit components may be inactive (e.g., turned off) during time interval 552 (FIG. 5).

In the operating mode associated with FIG. 7, signal OUT may switch from 3.3V to 1.8V. Detail operation of voltage level shifter 400 is as follows.

When signal $IN_{CTL}$ switches from 0V to 1.8V, transistor N2 may be turned off. Transistor N1 may turn on, causing the voltage at node 431 to go from approximately 1.8V (~1.8V) minus Vtn to 0V and the voltage at node 441 to go from 3.3V to 0V.

Device T2 may operate such that its capacitive coupling effect may cause the voltage at node 421 (which is coupled to the gate of transistor P3) to decrease (e.g., from voltage V1) to voltage Vy. In this example, if Vtn=0.5V, then Vy=1.8V–0.5=1.3V.

If the voltage at node 421 decreases (e.g., due to device T2 discharging) to a value lower than that of voltage Vy (e.g., lower than 1.3V), transistor N5 may turn on and pull node 421 to supply node 401. This causes the voltage at node 421 to be equal to 1.8V–Vtn=Vy (Vtn is threshold voltage of transistor N5). Thus, when signal $IN_{CTL}$ switches from 0V to 1.8V, device T2 and transistor N5 operate to bias the gate of transistor P4 with voltage Vy (which is less than voltage V1=1.8V in this example).

The voltage at node 411 may go to Vy+Vtp where Vy is the voltage at node 421. Vy+Vtp=(V1–Vtn)+Vtp=V1. Therefore, in this example, the voltage at node 411 may have a value of approximately 1.8V. This may cause transistor P2 to fully turn on and pull node 412 to supply node 402. Thus, node 412 may be provided with a voltage of 3.3V (which is the voltage at supply node 402), causing transistor P1 to turn off and transistor N7 to turn on.

Transistor P7 may turn on when the voltage at node 403 is 1.8V. Thus, when transistor N7 turns on, it pulls node 411 to supply node 401 through transistor P7. Transistor N7 may allow the voltages at node 411 to be less dependent on the threshold voltage.

Near the beginning of the operating mode associated with FIG. 7 (e.g., before transistor P2 turns on), transistor P8 may turn off to isolate supply node 401 from transistor N8 in order to prevent a contention between transistors N8 and P2 from happening.

Since the voltage at node 403 is 1.8V, transistor N6 may turn off. Transistor P6 may turn on and pull node 422 (which is coupled to the gate of transistor P4) to supply node 401. Thus, node 422 may be provided with a voltage of 1.8V (which is the voltage at supply node 401). As a result, transistor P4 may be biased at its gate with a voltage of 1.8V and cause the voltage at node 442 to go from 0V to 3.3V with safe electrical overstress condition.

As shown in FIG. 7, transistor N4 may turn on and cause the voltage at node 432 to go from 0V to approximately 1.8V–Vtn. The gates of transistors N3 and N4 may be coupled to supply node 401, such that transistors N3 and N4 turn on during time interval 552 (FIG. 5) to provide safe electrical overstress condition to transistors N1 and N2.

In this example, since the voltage at node 412 is approximately 3.3V, transistor P9 may turn off. Transistor N9 may turn on and pull output node 499 to supply node 401. Thus, output node 499 may be provided with a voltage of 1.8V. If voltage level shifter 400 is included in bias voltage unit 111 of FIG. 1 and node 499 of FIG. 6 corresponds to node 199 of FIG. 1, then a voltage of 1.8V (FIG. 6) may turn on transistor 131 of FIG. 1. This may cause signal $D_{OUT0}$ (FIG. 1) to switch to a level corresponding to a voltage Vcc (e.g., 3.3V), as described above with reference to FIG. 1.

As described above with reference to FIG. 4 through FIG. 7, at least part of voltage level shifter 400 (e.g., transistors P1, P2, P3, P4, P7, P8, N1, N2, N3, N4, N7, and N8) may form part (e.g., a transmitter) of a circuit (e.g., a transceiver circuit) that switches signals PreOUT and PreOUT* between different voltages (V1 and V2) greater than zero.

At least part of voltage level shifter 400 (e.g., device T1 and transistors N6 and P6) may form part (e.g., a transmitter) of a circuit (e.g., a transceiver circuit) to apply different voltages to the gate of transistor P4 at different time intervals (e.g., at time intervals 551 and 552 in FIG. 5). For example, device T1 and transistor N6 may hold the gate of the transistor P4 at voltage Vx (which is less voltage V1) during time interval 551. Transistor P6 may pull the gate of the transistor P4 to supply node 401 during time interval 552, such that the gate of the transistor P4 may be provided with a voltage (e.g., V1) equal to the voltage at supply node 401.

At least part of voltage level shifter 400 (e.g., device T2 and transistors N5 and P7) may form another part of the circuit to apply different voltages to the gate of transistor P3 at different time intervals (e.g., at time intervals 551 and 552 in FIG. 4). For example, transistor P5 may pull the gate of the transistor P3 to supply node 401 during time interval 551, such that the gate of the transistor P3 may be provided with a voltage (e.g., V1) equal to the voltage at supply node 401. In another example, device T2 and transistor N5 may hold the gate of the transistor P3 at voltage Vy (which is less voltage V1) during time interval 552.

Device T1 in FIG. 4 may be configured to influence a capacitive coupling between node 412 and the gate (at node 422) of transistor P4. For example, device T1 may be configured such that a capacitive coupling between node 422 and a reference node (e.g., reference node 409) may have a value greater than a value of a capacitive coupling between the gate and source (e.g., Cgs) of transistor P4. If device T1 includes a transistor configured to operate as a capacitor (e.g., as shown in FIG. 4), then such a transistor may have a size, such that a combination of a capacitive coupling between the gate and source (e.g., Cgs) of the transistor and a capacitive coupling between the gate and drain (e.g., Cgd) of the transistor may have a value greater than a value of the capacitive coupling between the gate and source of transistor P4.

Device T2 in FIG. 4 may be configured to influence a capacitive coupling between node 411 and the gate (at node 421) of transistor P3. For example, device T2 may be configured such that a capacitive coupling between node 421 and a reference node (e.g., reference node 409) may have value greater than a value of the capacitive coupling between the gate and source (e.g., Cgs) of transistor P3. If device T2 includes a transistor coupled to operate as a capacitor (e.g., as shown in FIG. 4), then the transistor may have a size, such that a combination of a capacitive coupling between the gate and source (e.g., Cgs) of the transistor and a capacitive coupling between the gate and drain (e.g., Cgd) source and the transistor may have a value greater than a value of the capacitive coupling between the gate and source of transistor P3.

Greater capacitive coupling associated with devices T1 and T2, as described above, may allow voltage level shifter 400 to operate properly. For example, if devices T1 and T2 are omitted from voltage level shifter 400 in FIG. 4, the voltage at node 412 (or node 411) may exceed the voltage (e.g., V1) provided by signal $IN_{V1}$ at node supply 401 in some situations, such as in a situation when voltages at supply node 401 or 402, or both, deviates from the normal operating values. In such a situation, transistor P1 or P2 may have a difficulty in turning on or may fail to turn on. The capacitive coupling effect of devices T1 and T2 (e.g., greater than Cgs of transistor P3 or P4), as described above, may prevent nodes 411 and 412 from exceeding the voltage at supply node 401 (e.g., V1) provided by signal $IN_{V1}$. As a result, transistors P1 and P2 may properly turn on or turn off and allow voltage level shifter 400 to operate properly.

Voltage level shifter 400 may have an improved (e.g., reduced) power consumption over some conventional voltage level shifters. For example, as mentioned above, some conventional voltage level shifters may include cascade transistors (e.g., transistors similar to transistors P3 and P4 of FIG. 4) and may bias the gates of such cascade transistors with a fixed bias voltage (e.g., 1.5V) less than a supply voltage in the conventional voltage level shifters. The fixed bias voltage may be provided by, for example, either a supply power generator or a local bias circuitry. Such a supply power generator or local biasing circuitry may consume a significant amount of idle power to keep the cascade transistors turned on for EOS safe reasons.

In voltage level shifter 400, as described above with reference to FIG. 6 and FIG. 7, the gates each of transistors P3 and P4 may be biased with a variable voltage (e.g., a variable voltage V1 and Vx or a variable voltage V1 and Vy) without using an additional supply power generator or bias circuitry. Therefore, power consumption in voltage level shifter 400 may be less than that of some conventional voltage level shifters. In some modes, such as an idle mode, idle power in voltage level shifter 400 may be significantly reduced. In many cases, the idle power may be reduced to zero or near zero. Thus, in some cases, voltage level shifter 400 may be preferable over some conventional voltage level shifters to be included in devices or systems (e.g., cellular phones, tablet computers, and others) where low power (e.g., low idle power) may be preferable.

Voltage level shifter 400 may also have reduced EOS risk and improved performance in comparison to some conventional voltage level shifters. For example, as described above with reference to FIG. 6 and FIG. 7, the gates of transistors P3 and P4 may be biased with approximately 1.8V (~1.8V) when their drains is 0V and may be pulled to 1.8V when their sources are 3.3V. This may reduce or remove EOS risk to voltage level shifter 400.

Some conventional voltage level shifters may include pre-output signals, which may be similar to signals PreOUT and PreOUT* of FIG. 4. The voltages provided by such pre-output signals may be dependent on the threshold voltage of the transistors of the conventional voltage level shifters. Thus, if the conventional voltage level shifters are included in a bias unit of a conventional driver (e.g., a bias unit similar to bias unit 111 of drivers 110 of FIG. 1), a mismatch in impedances between pullup and pulldown portions of the conventional driver may occur. The pullup portion of the conventional driver may include transistors similar to transistors 131 and 132 of FIG. 1. The pulldown portion of the conventional driver may include transistors similar to transistors 133 and 134 of FIG. 1. In the conventional driver, a mismatch in timing (e.g., rise time and fall time) of signals at nodes (e.g., nodes similar to nodes 196 and 199 in FIG. 1) may also occur. This may lead to variations in output signal crossover voltage and timing mismatch (rise/fall time) at the output node (e.g., node similar to node 120 or 121 in FIG. 1) of the conventional driver that uses conventional voltage level shifters.

Voltage level shifter 400 may improve (e.g., reduce) variations in output signal crossover voltage of drivers (e.g., $D_{OUT0}$ signal of drivers 110 of FIG. 1) if voltage level shifter 400 is included in such drivers. For example, in FIG. 1, bias circuit 114 of drivers 110 may include a basic four-transistor (e.g. 1.8V transistors) level shifter. Such transistors in bias circuit 114 may switch (e.g., turn on or off) the signal at node 196 at a relatively higher speed. As described above with reference to FIG. 6 and FIG. 7, the voltages provided by signals PreOUT and PreOUT* may be less dependent on the threshold voltage of the transistors of voltage level shifter 400. Thus, if included in bias circuit 111 (e.g., as a pull-up pre-driver) of FIG. 1, voltage level shifter 400 (FIG. 4) may reduce a mismatch in impedances between bias circuits 111 and 114 (FIG. 1) and may reduce a mismatch in timing (e.g., rise time and fall time) of the signals at nodes 196 and 199. This in turn may improve (e.g., reduce) variations in output signal crossover voltage of $D_{OUT0}$ signal at node 120 and variations in output signal crossover voltage of $D_{OUT1}$ signal at node 121. Thus, if voltage level shifter 400 is included in bias circuit 111, and drivers 110 are configured to operate according to USB specification, design effort to meet USB specification (e.g., rise time, fall time, rise/fall time mismatch, and output signal crossover voltage for low speed and full speed operations according to USB 2.0 specification) may be reduced.

Figure 8:
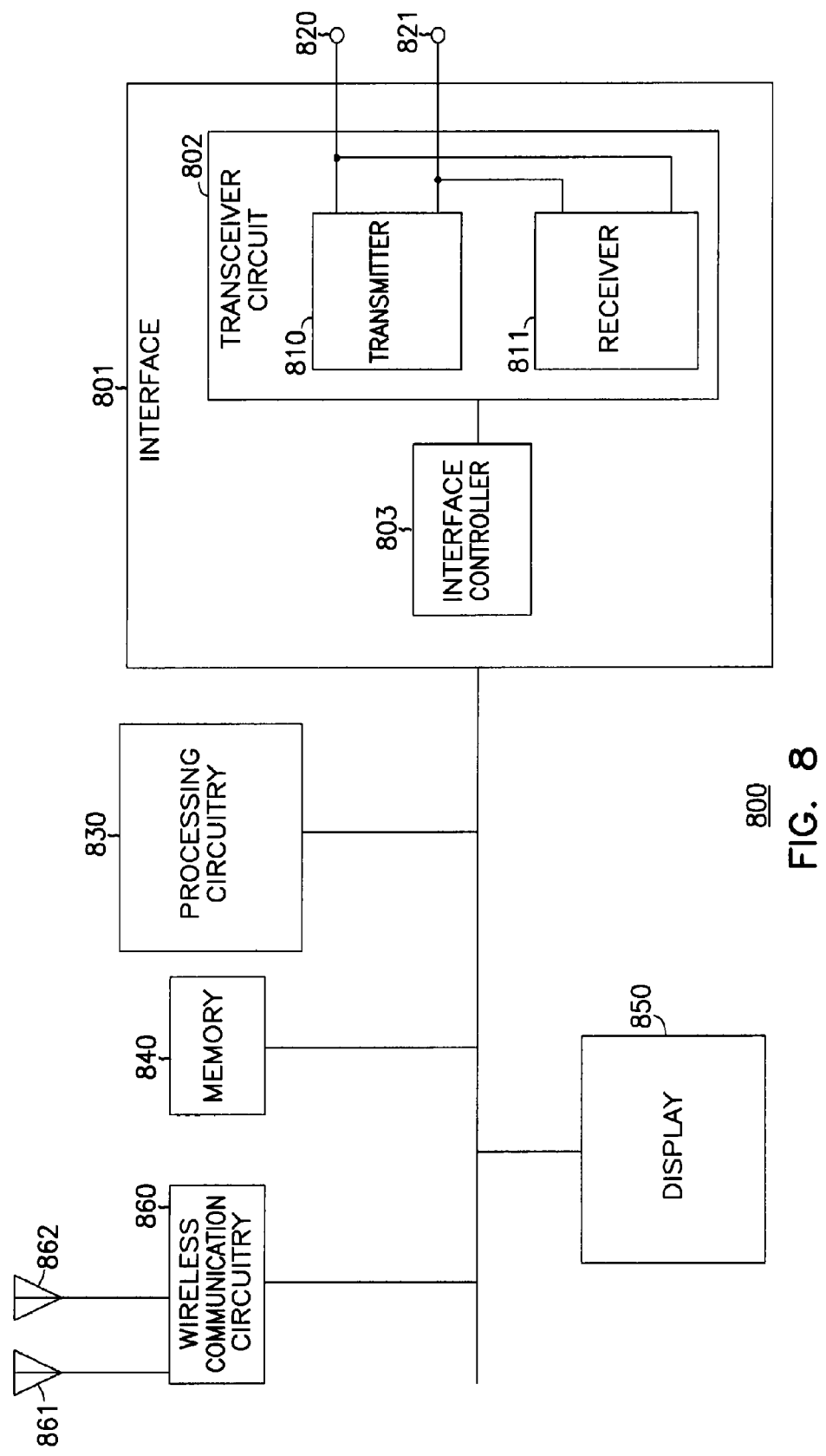
FIG. 8 shows an electronic system, according to some embodiments described herein.

FIG. 8 shows a block diagram of a system 800. System 800 may include an interface 801, processing circuitry 830, a memory 840, a display 850, wireless communication circuitry 860, and antennas 861 and 862. Interface 801 may include a transceiver circuit 802 having a transmitter 810 and a receiver 811 to transfer information (e.g., in form of signals) at nodes (e.g., input/output nodes) 820 and 821.

Receiver 811 may be configured to operate according to USB specification. For example, receiver 811 may operate to receive signals from nodes 820 and 821 (e.g., sent to system 800 by other devices or systems) according to USB specification, such as low speed and full speed operations according to USB 2.0 specification. For example, receiver 811 may receive signals from nodes 820 and 821 in the form of differential input signals.

Transmitter 810 may include drivers 110 of FIG. 1, such that nodes 820 and 821 in FIG. 8 may correspond to nodes 120 and 121, respectively, of FIG. 1. Transmitter 810 may include a voltage level shifter and its associated operations, such as voltage level shifter 200, 300, or 400, described above with referenced to FIG. 2A through FIG. 7. Transmitter 810 may be configured to operate according to USB specification, such as operate according to USB 2.0 specification to transfer signals in low speed and full speed operations. For example, transmitter 810 may provide signals to nodes 820 and 821 in the form of differential output signals.

Transceiver circuit 802 may be included in a USB port of interface 801, such that nodes 820 and 821 may be coupled to D+ and D− lines of the USB port. FIG. 8 shows system 800 including one transceiver circuit (e.g., transceiver circuit 802) as an example. System 800, however, may include multiple transceiver circuits where two or more of the multiple transceiver circuits may include components similar to or identical to those of transceiver circuit 802 and may be configured to operate as multiple USB ports in system 800.

Interface 801 may also include an interface controller 803 to control operation of interface 801 and/or control communication (e.g., transferring of signals) between interface 801 with other components within system 800 or between interface 801 and other devices or systems. Interface 801 may be configured to operate according to USB specification, such that interface controller 803 may include a USB controller to enable transmitter 810 to provide signals at node 820 and 821 with voltages according to USB specification (e.g., USB 2.0 specification).

Processing circuitry 830 may include a single processor or multiple processors. The processor or processors may include general-purpose processor type, application-specific integrated circuit (ASIC) type, or other types of processor. Processing circuitry 830 may be configured to communicate with interface 801 and wireless communication circuitry 860 to exchange information (e.g., data and other information) with other devices or systems.

Memory 840 may include volatile memory, non-volatile memory, or a combination of both. Memory 840 may contain instructions (e.g., firmware programs, software programs, or a combination of both), which when executed by processing circuitry 830 result in system 800 performing operations. Such operations may include operations described above with reference to FIG. 1 through FIG. 8.

Display 850 may include a liquid crystal display (LCD) or other types of display. Display 850 may include a touch sensitive screen (commonly referred to as "touchscreen").

Wireless communication circuitry 860 may be configured to communicate with a single type of network or with multiple types of networks. For example, wireless communication circuitry 860 may be configured to communicate (e.g., via antennas 861 and 862) with one or more devices or systems in IEEE 802.11 networks, cellular networks, or both IEEE 802.11 networks and cellular networks.

Antennas 861 and 862 may include one or more directional or omnidirectional antennas. For example, antennas 861 and 862 may include dipole antennas, monopole antennas, patch antennas, loop antennas, microstrip antennas or other types of antennas suitable for transmission of radio frequency (RF) signals. In some embodiments of system 800, instead of two antennas or more, a single antenna with multiple apertures may be used. In such embodiments, each aperture may be considered a separate antenna.

Although system 800 is illustrated as having several separate functional elements, one or more of the functional elements may be combined and may be implemented by combinations of software-configured elements, such as processing elements including digital signal processors (DSPs), and/or other hardware elements. A portion of system 800 or entire system 800 may be referred to as a module.

The embodiment associated with apparatuses (e.g., IC 100, voltage level shifters 200, 300, and 400), systems (e.g., system 800), and methods (e.g., operations associated with IC 100, voltage level shifters 200, 300, and 400, and system 800) may be implemented in one or a combination of hardware, firmware and software. These embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, one or more processors and may be configured with instructions stored on a computer-readable storage device to implement the various operations described herein.

The illustrations of apparatuses (e.g., IC 100, voltage level shifters 200, 300, and 400), systems (e.g., system 800), and methods (e.g., operations associated with IC 100, voltage level shifters 200, 300, and 400, and system 800) are intended to provide a general understanding of the structure of various embodiments and are not intended to provide a complete description of all the elements and features of apparatuses that might make use of the structures described herein.

Any of the components described above with reference to FIG. 1 through FIG. 8 can be implemented in a number of ways, including simulation via software. Thus, apparatuses (e.g., IC 100, voltage level shifters 200, 300, and 400), systems (e.g., system 800) described above may all be characterized as "modules" (or "module") herein. Such modules may include hardware circuitry, single and/or multi-processor circuits, memory circuits, software program modules and objects and/or firmware, and combinations thereof, as desired by the architect of the apparatuses (e.g., IC 100, voltage level shifters 200, 300, and 400), systems (e.g., system 800) and as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

IC 100, voltage level shifters 200, 300, and 400), systems (e.g., system 800) described above may be included in apparatuses (e.g., electronic circuitry) such as high-speed computers, communication and signal processing circuitry, single or multi-processor modules, single or multiple embedded processors, multi-core processors, message information switches, and application-specific modules including multilayer, multi-chip modules, and memory devices. Such apparatuses may further be included as sub-components within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 5) players), vehicles, medical devices (e.g., heart monitor, blood pressure monitor, etc.), set top boxes, and others.

The embodiments described above with reference to FIG. 1 through FIG. 8 include apparatuses, systems, and methods having a reference node to receive a reference voltage, a first node to provide a signal, and a circuit. Such a circuit may include a second node to receive different voltages greater than the reference voltage and to cause the signal at the first node to switch between a first voltage greater than the reference voltage and a second voltage greater than the reference voltage. Other embodiments including additional apparatuses and methods are described.

The above description and the drawings illustrate some embodiments to enable those skilled in the art to practice the embodiments of the inventions. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description. Therefore, the scope of various embodiments of the invention is determined by the appended claims, along with the full range of equivalents to which such claims are entitled.

The Abstract is provided to comply with 37 C.F.R. §1.72(b) requiring an abstract that will allow the reader to quickly ascertain the nature and gist of the technical disclosure. The Abstract is submitted with the understanding that it will not be used to interpret or limit the scope or meaning of the claims.

What is claimed is:

1. An apparatus to switch signals, the apparatus comprising:
    a reference node to receive a reference voltage;
    a first node to provide a signal; and
    a circuit including a second node to receive different voltages greater than the reference voltage and to cause the signal at the first node to switch between a first voltage greater than the reference voltage and a second voltage greater than the reference voltage, wherein the circuit includes a transistor having a gate coupled to the second node, the transistor having a voltage tolerance less than a supply voltage of the circuit, a first additional transistor coupled between the gate of the transistor and a supply node, a second additional transistor coupled between the gate of the transistor and the supply node, and a third additional transistor coupled between the transistor and the reference node, the third additional transistor including a gate coupled to the supply node.

2. An apparatus to switch signals, the apparatus comprising:
    a reference node to receive a reference voltage;
    a first node to provide a signal; and
    a circuit including a second node to receive different voltages greater than the reference voltage and to cause the signal at the first node to switch between a first voltage greater than the reference voltage and a second voltage greater than the reference voltage, a transistor having a gate coupled to the second node, the transistor having a voltage tolerance less than a supply voltage of the circuit, a first additional transistor coupled between the first node and a first supply node, and a second additional transistor coupled between the first node and a second supply node;
    an output node;
    a third additional transistor coupled between the output node and the first supply node; and
    a fourth additional transistor coupled between the output node and the second supply node.

3. The apparatus of claim 2, wherein the reference node includes a ground potential node.

4. The apparatus of claim 2, further comprising a transmitter, wherein the circuit is included in the transmitter, and the transmitter is configured to operate according to Universal Serial Bus (USB) specification.

5. An apparatus to switch signals, the apparatus comprising:
- a reference node to receive a reference voltage;
- a first node to provide a signal; and
- a circuit including a second node to receive different voltages greater than the reference voltage and to cause the signal at the first node to switch between a first voltage greater than the reference voltage and a second voltage greater than the reference voltage, wherein the circuit includes a transistor having a gate coupled to the second node, the transistor having a voltage tolerance less than a supply voltage of the circuit, a third node to provide an additional signal, and a fourth node to receive additional different voltages greater than the reference voltage and to cause the additional signal at the third node to switch between a third voltage greater than the reference voltage and a fourth voltage greater than the reference voltage.

6. The apparatus of claim 5, wherein the circuit further includes:
- a first device coupled to the second node, the first device to influence a capacitive coupling between the first node and the second node; and
- a second device coupled to the fourth node, the second device to influence a capacitive coupling between the third node and the fourth node.

7. An apparatus to switch signals, the apparatus comprising:
- a first supply node to receive a first voltage greater than zero;
- a second supply node to receive a second voltage greater than zero;
- a first node;
- a second node;
- a circuit to operatively couple the first node to the first supply node during a first time interval and to operatively couple the first node to the second supply node during a second time interval, and the circuit to hold the second node at a voltage less than the first voltage during the first time interval and to operatively couple the second node to the first supply node during the second time interval;
- a third node, and the circuit to operatively couple the third node to the second supply node during the first time interval and to operatively couple the third node to the first supply node during the second time interval; and
- a fourth node, and the circuit to operatively couple the fourth node to the first supply node during the first time interval and to hold the fourth node at a voltage less than the first voltage during the second time interval.

8. An apparatus to switch signals, the apparatus comprising:
- a first supply node to receive a first voltage greater than zero;
- a second supply node to receive a second voltage greater than zero;
- a first node;
- a second node;
- a circuit to operatively couple the first node to the first supply node during a first time interval and to operatively couple the first node to the second supply node during a second time interval, the circuit to hold the second node at a voltage less than the first voltage during the first time interval and to operatively couple the second node to the first supply node during the second time interval, wherein the circuit further includes a first transistor coupled between the first node and a reference node, the transistor including a gate to receive a voltage, such that the first transistor is turned on during the first and second time intervals, and a second transistor coupled between the third node and the reference node, the second transistor including a gate to receive a voltage, such that the second transistor is turned on during the first and second time intervals;
- a third node, and the circuit to operatively couple the third node to the second supply node during the first time interval and to operatively couple the third node to the first supply node during the second time interval;
- an output node; and
- an additional circuit to respond to a signal at the first node, to operatively couple the output node to the second supply node during the first time interval, and to operatively couple the output node to the first supply node during the second time interval.

9. The apparatus of claim 8, further comprising:
- a third node; and
- an output stage to respond to a signal at the output node to switch a signal at the third node between an additional voltage and zero.

10. The apparatus of claim 9, wherein the output stage includes a transistor having a voltage tolerance less than the additional voltage, and the transistor is configured to switch the signal at the third node according to Universal Serial Bus (USB) specification.

11. An electronic system comprising:
- a transmitter including a reference node to receive a ground potential, an output stage, and a bias circuit coupled to the output stage, the bias circuit including a first node, and a second node to receive different voltages greater than the ground potential and to cause a first signal at the first node of the bias circuit to switch between a first voltage greater than the ground potential and a second voltage greater than the ground potential, the output stage to provide a second signal based on the first signal, wherein the bias circuit includes a transistor having a gate coupled to the second node, the transistor having a voltage tolerance less than a supply voltage of the bias circuit, a first additional transistor coupled between the gate of the transistor and a supply node, a second additional transistor coupled between the gate of the transistor and the supply node, and a third additional transistor coupled between the transistor and the reference node, the third additional transistor including a gate coupled to the supply node;
- a module to enable the transmitter to provide the second signal with voltages according to Universal Serial Bus (USB) specification; and
- a display coupled to the module.

12. The electronic system of claim 11, wherein the transmitter includes transistors having a voltage tolerance less than a supply voltage of the transmitter.

13. The electronic system of claim 11, wherein the voltage tolerance of the transistors is equal to the first voltage, and the second voltage is equal to the supply voltage.

14. The electronic system of claim 13, wherein the first voltage includes value of 1.8 volts, the second voltage includes a value of 3.3 volts.

15. The electronic system of claim 14, further comprising a receiver configured to operate according to Universal Serial Bus (USB) 2.0 specification.

\* \* \* \* \*